United States Patent
Da Silva Weber et al.

(10) Patent No.: US 11,678,459 B2
(45) Date of Patent: Jun. 13, 2023

(54) VENTILATION AND AIR CONDITIONING SYSTEM WITH A PASSIVE EMERGENCY COOLING MODE

(71) Applicant: FRAMATOME GmbH, Erlangen (DE)

(72) Inventors: Christof Da Silva Weber, Herzogenaurach (DE); Laura Klaus, Leinburg (DE)

(73) Assignee: FRAMATOME GmbH, Erlangen (DE)

( * ) Notice: Subject to any disclaimer, the term of this patent is extended or adjusted under 35 U.S.C. 154(b) by 295 days.

(21) Appl. No.: 16/767,576

(22) PCT Filed: Nov. 30, 2017

(86) PCT No.: PCT/EP2017/081007
§ 371 (c)(1),
(2) Date: May 27, 2020

(87) PCT Pub. No.: WO2019/105559
PCT Pub. Date: Jun. 6, 2019

(65) Prior Publication Data
US 2020/0390002 A1    Dec. 10, 2020

(51) Int. Cl.
*H05K 7/20* (2006.01)
*F28D 20/02* (2006.01)
(Continued)

(52) U.S. Cl.
CPC .......... *H05K 7/20145* (2013.01); *F24F 7/00* (2013.01); *F28D 20/02* (2013.01);
(Continued)

(58) Field of Classification Search
CPC ................. F28D 20/02; F28D 20/023; F28D 2020/0008; F28D 20/0056; F24F 11/0001;
(Continued)

(56) References Cited

U.S. PATENT DOCUMENTS 4,170,261 A * 10/1979 Laing ...................... F24V 99/00
                                                            126/400
6,468,054 B1 * 10/2002 Anthony ................. F04D 25/12
                                                            454/239
(Continued)

FOREIGN PATENT DOCUMENTS

CN      111373203 A     5/1998
CN      101737880 A     6/2010
(Continued)

OTHER PUBLICATIONS

Corresponding Search Report and Written Opinion for PCT/EP2017/081007, along with Applicant's response.

*Primary Examiner* — Mandeep S Buttar
(74) *Attorney, Agent, or Firm* — Davidson, Davidson & Kappel, LLC

(57) ABSTRACT

A ventilation and air conditioning system (6) is for a room (2) containing a heat source and the ventilation and air conditioning system (6) comprising a cooled air supply (12) and a ventilation duct (10). The ventilation duct (10) includes a primary inlet (24) connected to the cooled air supply (12) and an outlet (14) leading into the room (2). A number of heat storage elements (30) is arranged inside the ventilation duct (10) between the primary inlet (24) and the outlet (14), such that during operation of the cooled air supply (12) there is a forced stream of cooled air through the ventilation duct (10), thereby cooling and preferably freezing the heat storage elements (30). A secondary inlet (36) into the ventilation duct (10) is in flow communication with the room (2) and during operation of the cooled air supply (12) is closed by a damper (40). The damper (40) is designed to automatically open in a passive manner when the forced stream of cooled air from the cooled air supply (12) stops, such that a natural convection airflow through the ventilation
(Continued)

duct (10) is supported, and the natural convection airflow is cooled by transferring heat to the heat storage elements (30).

13 Claims, 3 Drawing Sheets

(51) Int. Cl.
  *F24F 7/00* (2021.01)
  *F28D 20/00* (2006.01)
(52) U.S. Cl.
  CPC .... H05K 7/20127 (2013.01); *F24F 2007/004* (2013.01); *F28D 2020/0008* (2013.01)
(58) Field of Classification Search
  CPC .............. F24F 5/0021; F24F 2007/004; F24F 2011/0002; F24F 2012/007; F24F 13/08; F24F 13/10; F24F 2110/40; F24F 7/08; F24F 11/30; F24F 2110/12; F24F 11/70; F24F 13/14; G06F 1/3203; H05K 7/20745; H05K 7/20754; H05K 7/20127; H05K 7/20145
  USPC ..... 361/679.47; 165/59, 248, 250, 280, 287, 165/104.18, 54, 240; 454/239
  See application file for complete search history.

(56) References Cited

U.S. PATENT DOCUMENTS

| | | | | |
|---|---|---|---|---|
| 6,896,612 | B1* | 5/2005 | Novotny | H05K 7/20781 361/691 |
| 2012/0037342 | A1* | 2/2012 | Holloway | F24F 5/0021 165/104.21 |
| 2013/0055748 | A1* | 3/2013 | Mahajan | F04D 29/582 62/262 |
| 2015/0083363 | A1 | 3/2015 | Lindenstruth et al. | |
| 2017/0339803 | A1* | 11/2017 | Kaun | F04D 27/003 |
| 2018/0213684 | A1* | 7/2018 | Bailey | F25B 49/022 |
| 2019/0115114 | A1* | 4/2019 | Sineath | G21C 9/00 |
| 2019/0143783 | A1* | 5/2019 | He | F28D 20/02 62/498 |
| 2021/0156601 | A1* | 5/2021 | Melink | F25B 49/02 |

FOREIGN PATENT DOCUMENTS

| | | |
|---|---|---|
| CN | 105569213 A | 5/2016 |
| JP | 04217738 A | 8/1992 |
| JP | 05047730 U | 6/1993 |
| JP | H1089732 A | 4/1998 |
| JP | H10132338 A | 5/1998 |
| JP | 2003185185 A | 7/2003 |
| JP | 2008089285 A | 4/2008 |
| JP | 2012026620 A | 2/2012 |
| RU | 2087807 C1 | 8/1997 |
| RU | 2168116 C2 | 5/2001 |
| RU | 2411418 C1 | 2/2011 |
| RU | 2419038 C2 | 5/2011 |
| RU | 2623495 C2 | 6/2017 |
| WO | WO2012093938 A1 | 7/2012 |
| WO | WO-2012142262 A1 * | 10/2012 ......... H05K 7/20818 |

* cited by examiner

VENTILATION AND AIR CONDITIONING SYSTEM WITH A PASSIVE EMERGENCY COOLING MODE

The present disclosure relates to a ventilation and air conditioning system for a room. It also relates to a corresponding operating method.

BACKGROUND

Modern I&C control systems, in particular in nuclear power plants, have more intensive heat emissions into the installation room and the cooling function has got more important. Normally the cooling is achieved by an active ventilation and air conditioning system blowing cooled air into the installation room. In case of loss of active cooling function the grace period before the installed equipment reaches the maximum allowed temperature is usually approx. 2 hours only.

SUMMARY

An objective of the present disclosure is to provide some kind of emergency cooling for an active ventilation and air conditioning system in the event of loss of active cooling functions, in particular due to power outage. In particular, the present grace period shall be prolonged. The system shall work reliably and shall be easy to install and maintain.

A ventilation and air conditioning system for a room in a building is provided, the room containing a heat source and the ventilation and air conditioning system comprising a cooled air supply and a ventilation duct,
the ventilation duct comprising a primary inlet being connected to the cooled air supply and an outlet leading into the room,
wherein a number of heat storage elements is arranged inside the ventilation duct between the primary inlet and the outlet,
such that during operation of the cooled air supply there is a forced stream of cooled air through the ventilation duct, thereby cooling the heat storage elements,
wherein there is a secondary inlet into the ventilation duct which is in flow communication with the room and which during operation of the cooled air supply is closed by a damper, and
wherein the damper is designed to automatically open in a passive manner when the forced stream of cooled air from the cooled air supply stops,
such that a natural convection airflow through the ventilation duct is supported, wherein the natural convection airflow is cooled by transferring heat to the heat storage elements.

In short, the the present disclosure provides a passive switchover from active room cooling to passive cooling with the help of heat storage elements and a passive non-return damper. There is a passive switchover from a forced cooling mode, wherein the heat storage elements inside the ventilation duct are cooled, to a natural convection cooling mode, wherein the previously cooled heat storage elements provide cooling capacity for the natural convection airflow. Hence, if the active cooling subsystem stops to operate (e.g. due to electrical power outage) there is still some emergency cooling for a grace period of some hours (until the cooling capacity of the heat storage elements is exceeded). After passive cooling, when the active subsystem returns, the system switches back to normal cooling function automatically.

Preferably, the heat storage elements comprise a phase change material. A phase change material (PCM) is a substance with a high heat of fusion which, melting and solidifying at a certain temperature, is capable of storing and releasing large amounts of energy. Heat is absorbed or released when the material changes from solid to liquid and vice versa; thus, PCMs are classified as latent heat storage units.

Preferably, the phase change material undergoes a solid-liquid phase transition in the temperature range mainly from 16° C. to 30° C.

Preferably, the phase change material is based on or comprises salt hydrates. Advantages include: high volumetric latent heat storage capacity, availability and low cost, relatively sharp melting point, high thermal conductivity, high heat of fusion, nonflammable.

Preferably, the heat storage elements have a plate-like or sheet-like shape respectively. Hence, they can be stacked in parallel and/or behind each other (in so-called blocks) with gaps for the airflow in between.

Preferably, the damper is designed to automatically close in a passive manner due to the prevailing airflow pressure inside the ventilation duct during operation of the cooled air supply.

Preferably, the opening force acting on the damper is achieved by a mass and/or a spring. It is therefore permanently acting on the damper and opens it once the closing force falls below the opening force.

Preferably, the outlet of the ventilation duct is placed close to the floor of the room and the secondary inlet is placed close to the ceiling of the room in order to support the natural convection airflow. For the same reason, the ventilation duct is essentially straight-lined and aligned vertically.

The corresponding operating method is characterized in that during operation of the cooled air supply the heat storage elements are cooled by the forced stream of cooled air, wherein during subsequent natural convection mode the heat storage elements act as coolers for the natural convection airflow.

In summary, an embodiment of the ventilation and air conditioning system according to the invention can operate as follows:
a) In normal operation the supply air is led through a housing which contains PCM modules (preferably installed in an earthquake proven construction).
b) The supply air with a temperature of approx. +17° C. freezes the PCM inside the modules.
c) The block of PCM modules inside the housing is designed for a certain pressure drop with the forced airflow in normal operation.
d) This differential pressure of air via the block of PCM modules ensures, that a special non-return damper, preferably with weight lever is kept closed, so that the air must pass the PCM modules to keep them permanently frozen at +17° C., so that the safety classified housing with PCM modules is potentially permanent available.
e) In normal operation the supply air leaves the PCM block housing at floor area and is distributed to the equipment to be cooled by free ventilation in floor (the higher density of cool supply air keeps the airflow at a low room level).
f) In case that the supply air is lost (any loss of active cooling airflow) the special non-return damper which is installed in the upper part of the construction opens.
g) The air inside the room is heated by the electrical (or other heat-dissipating) installations and rises to the room ceiling.

h) There the heated air enters through the open non-return damper (quasi without pressure loss due to the low airflow) into the PCM block housing.

i) The air flows through the gaps between the vertically installed PCM modules and cools down when passing the surface of the PCM plates. The heat of the air passes into the PCM material which has a noticeable peak at a certain temperature range, where the air temperature is quasi constant due to the latent heat inclusion into the PCM material.

j) The warmer the room air temperature under the ceiling rises, the higher the density difference of air outside and inside the PCM block is. With this difference an inherently safe convection airflow in the gaps between the PCM modules is created and maintained as long as the temperature of the PCM is lower than the room air temperature. The constant temperature of the PCM in a wide range of the melting capacity is the main positive effect of latent energy storage and beneficial for the room air temperature behavior.

k) The cooled air leaves the PCM block in the floor area and is routed by natural draft to the heat generating installations.

l) In case that the forced ventilation gets activated again (re-energizing of electrical power), the special non-return damper closes again and the PCM modules are getting frozen again.

m) An optional temperature measurement upstream and downstream of the PCM block ensures reliable information about the thermal loading condition of the PCM modules.

n) The system works without additional electrical equipment (except for the optional temperature measurements for thermal loading condition).

The system according to the present disclosure may ensure an inherent safe cooling of a room for a certain time period which is called "grace period". During this defined grace period the maximum allowable room air temperature is not exceeded, so that the installed equipment can operate within the defined room air conditions.

The required grace period is basis for the sizing of the installed mass of PCM inside the ventilation duct. A grace period of 24 hours can be realized with bearable efforts. On this basis the safety of room cooling is increased, and—in a nuclear context—the classification of the active parts of the room cooling HVAC system can be lowered which results in a massive cost reduction.

BRIEF DESCRIPTION OF THE DRAWINGS

An exemplary embodiment of the invention is shown in the accompanying schematic figures and described in more detail in the subsequent paragraphs.

DETAILED DESCRIPTION

Figure 1:
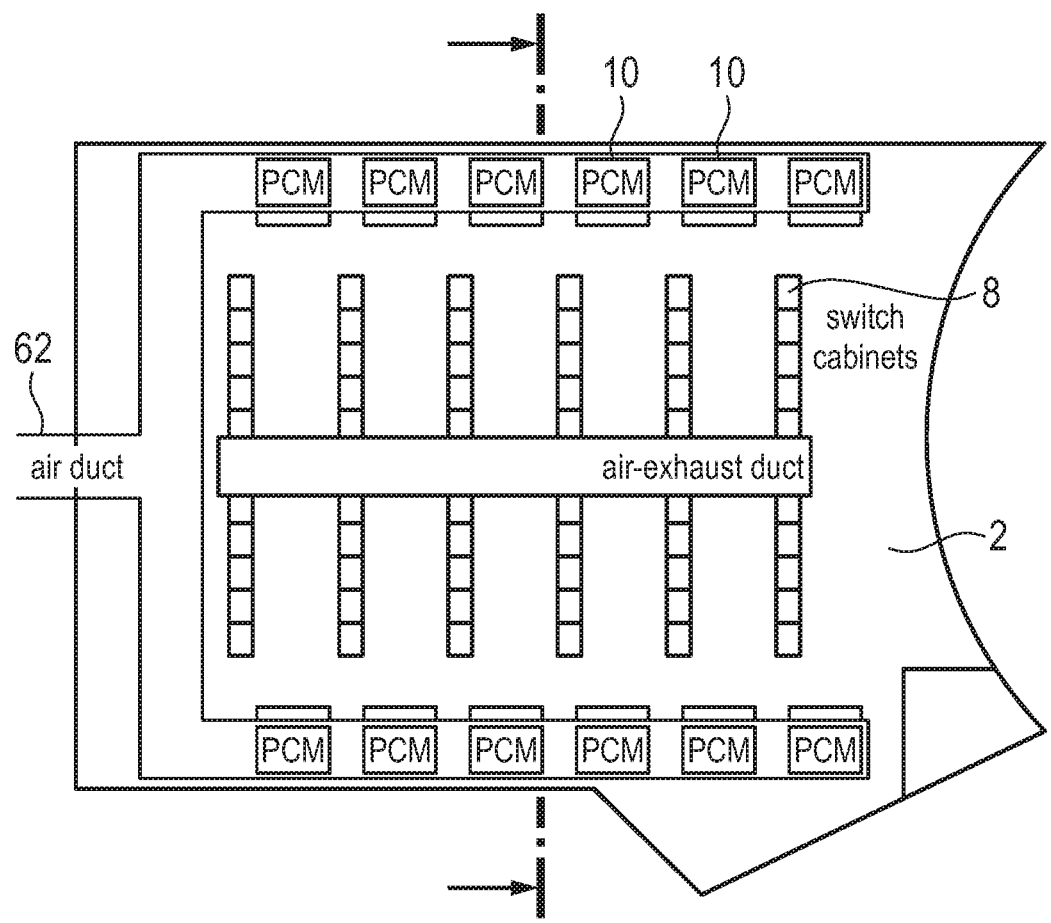
FIG. 1 shows a top view of a room which contains a number of electric or electronic instrumentation and control (I&C) components which during operation produce waste heat.

Similar components are marked with the same reference numerals throughout the figures.

FIG. 1 shows a top view of a room 2, in particular a control room in a nuclear power plant, which contains a number of electric/electronic components, in particular instrumentation and control (I&C) components 4, which during operation produce waste heat. In order to keep the room temperature below an acceptable maximum value there is a ventilation and air conditioning (VAC) system 6 which during operation blows cooled air into the room 2. In some embodiments there is an additional heating system integrated, yielding a combined heating, ventilation and air conditioning (HVAC) system.

Figure 2:
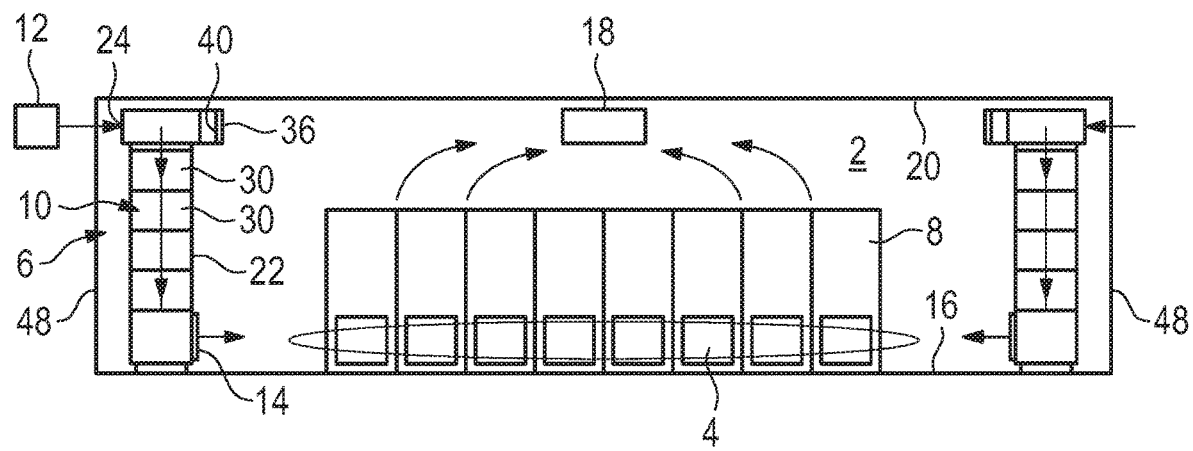
FIG. 2 shows a sectional side view of the room along the intersection indicated in FIG. 1, wherein a ventilation and air conditioning (VAC) system is installed and wherein an active ventilation mode is visualized by arrows indicating air flow.

The normal operation mode of the VAC system 6 is visualized in FIG. 2 which shows a sectional side view of the room 2 along the intersection indicated in FIG. 1. By way of example the I&C components 4 are placed inside cabinets 8 in a central region of the room 2. The according VAC system 6 comprises a ventilation duct 10 which on the inlet side is connected to a cooled air supply 12. The cooled air supply 12 which is only schematically indicated in FIG. 2 may be arranged outside the room 2. Apart from the outlet 14 the ventilation duct 10 may also be arranged, at least in parts, outside the room 2 (see further below). The ventilation duct 10 may comprise further sections not shown here. The cooled air supply 12 may comprise an electric air cooler, for example of a refrigerator type with a vapor-compression cycle or with thermoelectric cooling, and a fan or ventilator for generating a forced cooled air flow through the ventilation duct 10. During normal operation the cooled air leaves the ventilation duct 10 at outlet 14 which leads into the room 2. By way of example, the outlet 14 is arranged close to the floor 16 of the room 2 in a peripheral region around the I&C components 4. Hence, these components are flown over by cooled air, and waste heat emerging from them is transferred to the air flow. The heated air flow is then drawn from the room 2 via an air exhaust opening 18, preferably located in an upper region of the room 2 shortly below the ceiling 20, with the help of another fan. In FIG. 2 the air flow through the ventilation duct 10 and through the room 2 is visualized by corresponding arrows.

Figure 3:
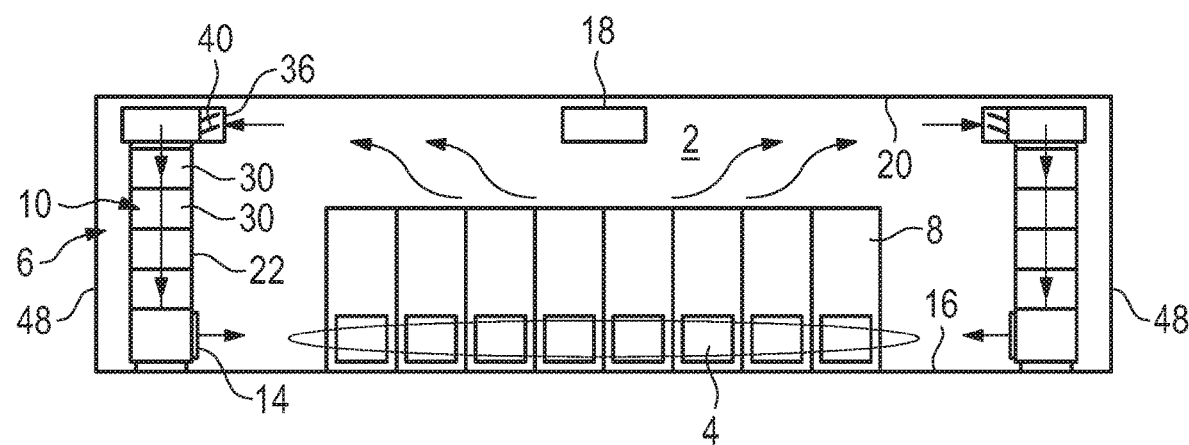
FIG. 3 shows the sectional side view of FIG. 1, wherein a passive ventilation mode is visualized.

If, for example due to loss of electrical power, the cooled air supply 12 ceases to operate temperatures within the room 2 and among the I&C components 4 might exceed a critical value rather soon. In order to deal with such a situation the VAC system 6 is equipped with a passive (emergency) cooling system and with a passive switchover mechanism from the active cooling mode to the passive cooling mode. This passive cooling mode is illustrated in FIG. 3 showing the same sectional side view of the room 2 as in FIG. 1. Details of the passive cooling system and the passive switchover mechanism, both of which are integrated within or attached to the ventilation duct 10, are shown in FIG. 4 in a sectional view.

Figure 4:
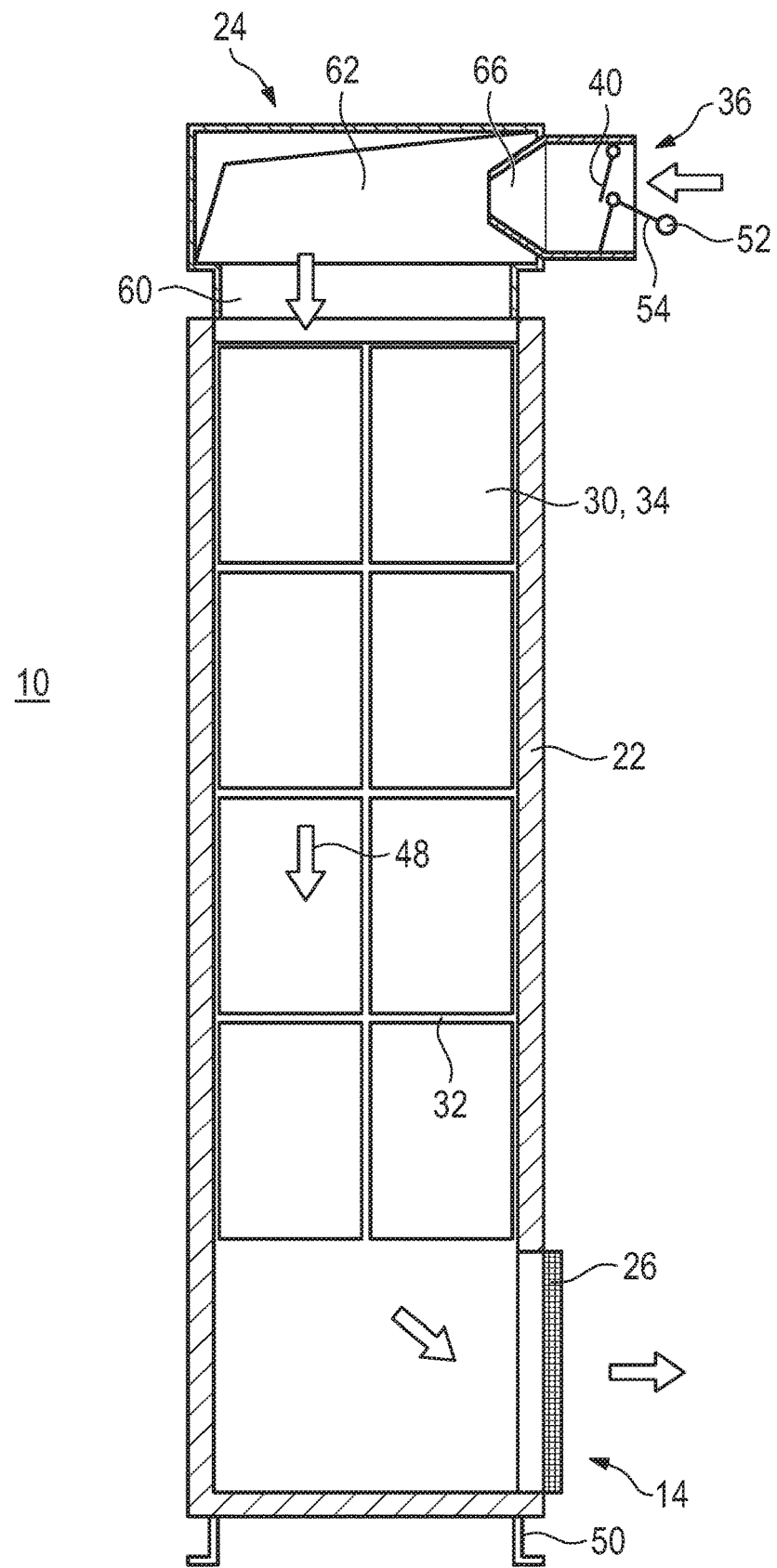
FIG. 4 shows a more detailed sectional view of a ventilation duct seen in FIG. 2 and FIG. 3.

As can be seen from FIG. 3 and in some more detail in FIG. 4, the ventilation duct 10 or channel preferably comprises a straight-lined section which is aligned vertically, corresponding to a downwardly directed cooling air flow during normal cooling operation. The ventilation duct 10 is enclosed by housing 22. At the top there is a primary inlet 24 being fluidically connected to the cooled air supply 12 via an air supply duct. At the bottom, preferably arranged slightly above the floor 16 of the room 2, there is the outlet 14 which leads into the room 2. The outlet 14 may comprise a grille 26.

Inside the ventilation duct 10 there is number of heat storage elements 30 arranged with the help of a support structure 32, such that during normal operation they are flown over by they forced stream of cooled air provided by the cooled air supply 12. There is some pressure drop caused by the heat storage elements 30, but the remaining free space between the heat storage elements 30 and/or between the heat storage elements 30 and the housing 22 ensures that the air flow through the ventilation duct 10 is not blocked. Preferably, the heat storage elements 30 have a plate-like shape with flat sides being aligned in parallel to the main flow direction indicated by arrows. Several of them can be installed in parallel and/or behind each other with respect to the flow direction. The heat storage elements 30 are preferably made of or comprise a phase change material (PCM) 34, and therefore they are also called PCM elements or PCM blocks or PCM plates or PCM modules. The PCM 34 is chosen such that during normal operation the cooled air provided by the cooled air supply 12, which for example has a temperature of 17° C., freezes the PCM 34 so that it is in a solid state.

Therefore, during normal operation the forced cooled air flow through the ventilation duct 10 cools down and freezes the heat storage elements 30 and prepares them for a subsequent emergency cooling mode. After passing the heat storage elements 30 the cooled air exits the ventilation duct 10 at outlet 14, blowing into the room floor area between the cabinets 8. Heated air as a consequence of the I&C waste heat rises and is extracted from the room 2 at air exhaust 18 under the ceiling 20.

Upstream to the heat storage elements 30, i.e. above them, there is a secondary inlet 36 into the ventilation duct 10 which is in flow communication with the room 2. Preferably, the secondary inlet 36 is arranged close to the ceiling 20 of the room 2. During normal operation of the cooled air supply 12 the secondary inlet 36 is closed by a damper 40 or a flap. In the case of loss of (H)VAC operation, however, the damper 40 opens automatically as described further below. Due to the prevailing temperature stratification in the room 2, hot air with a temperature in the range of, for example, 24° C. to 52° C. now enters the ventilation duct 10 via the secondary inlet 36 and gives off heat to the heat storage elements 30 therein, the hot air thereby being cooled and sinking down in the same flow direction as in the active cooling mode. In this way a natural convection flow through the room 2 and through the ventilation duct 10 is established and supported as long as the cooling capacity of the heat storage elements 30 is not exceeded. This passive cooling mode is visualized in FIG. 3 by arrows indicating the flow direction.

During the passive cooling process the PCM 34 of the heat storage elements 30 gets heated by the hot airflow passing by, thereby changing its state from solid to liquid (melting). Due to the phase change and the according latent heat involved a rather large heat storage capacity can be achieved. The PCM elements thus act as latent heat storage, providing cooling capacity for the natural convection airflow. Consequently, the temperature of the PCM 34 is kept roughly constant until it is molten completely.

The ventilation duct 10 shown in FIG. 4 may be arranged inside the room 2, i.e. within the space enclosed by the surrounding walls 48 as shown in FIG. 3. However, in an alternative embodiment the ventilation duct 10 may be placed inside the wall 48 itself or beyond the wall 48 in another room, as long as the secondary inlet 36 and the outlet 14 branch into the room 2. However, it is preferred to keep the entire flow path rather short and straight-lined in order to support the natural convection flow. In either embodiment it is preferable to include thermic insulation within and/or around the housing 22. Maintenance doors or windows in the housing 22 facilitating access to the heat storage elements 30 are also advantageous. The whole housing 22 preferably has a modular structure, thus facilitating easy installation and expansion, if required. A base frame 50 at the bottom of the ventilation duct 10 ensures secure and vibration safe standing on the floor 16. Preferably, a connection piece 60 at the top ensures flexible connection to a supply air duct coming from the cooled air supply 12. The internal support structure 32 to which the heat storage elements 30 are attached is preferably designed to withstand and absorb or dampen seismic loads.

For a completely passive switchover from active to passive cooling operation there is a special non-return damper, or briefly damper 40, placed within or shortly after the secondary inlet 36 which is automatically closed during active cooling operation by virtue of the prevailing pressure of the forced air flow, given the back-pressure caused by the heat storage elements 30. The damper 40 is designed to automatically open in a passive manner when the forced stream of cooled air and hence the according closing pressure stops. This is preferably achieved by a spring element and/or by a mass 52 and/or its own weight pulling the damper 40 into the open state. There may be a lever 54, in particular a spring- and/or weight loaded lever, in order to increase the opening force to a suitable level. In other words, the damper 40 is drawn and kept open in the rest position by virtue of a spring force and/or a weight and is only closed by the forced-flow induced pressure inside the ventilation duct 10 which exceeds the opening force. After return of the forced ventilation and cooling the damper 40 automatically closes again, so that the heat storage elements 30 are cooled down and frozen again.

The details of the construction may vary to some extent. For example, the primary inlet 24 and the secondary inlet 36 may be placed on opposite sides at the top of the housing 22 as indicated in FIGS. 2 and 3, or alternatively side by side or above each other or in any other suitable way. In an alternative embodiment indicated in FIG. 4 they may be placed within a section of the supply air duct 62 which is connected to the housing 22 by virtue of a connection piece 60. In this case the according section of the supply air duct 62 can be regarded as a part of the ventilation duct 10. Additional guide vanes 66 may be advantageous to give—with stating of the active ventilation airflow—a sufficient impulse to the non-return damper to change the position from open to close. Of course, several of the ventilation ducts 10 can be placed within a single room 2, preferably in a parallel configuration with respect to the forced airflow provided by the cooled air supply 12. In this case the supply air duct 62 comprises according branches as indicated in FIG. 1. Of course, the heat source inside the room 2 may be of a different type than the electric/electronic components described so far.

All in all, a relatively long grace period, preferably 24 hours in a nuclear context, of passive (emergency) cooling is achieved after the loss of (H)VAC operation, provided that the number of heat storage elements 30, the specific PCM 34, and the geometry of the flow channels are suitably chosen with respect to the actual cooling needs.

The PCM 34 of the heat storage elements 30 is preferably chosen such that it gets frozen when in contact with the cooled airflow provided by the cooled air supply 12 which typically has a temperature in the range from 16° C. to 30° C. On the other hand the PCM 34 preferably melts during natural convection mode at a melting temperature in the range from 16° C. to 30° C. With respect to this freezing/melting hysteresis has to be taken into account.

Suitable materials comprise paraffins or salt hydrates. PCM blocks based on salt hydrates are preferred since they are not flammable or at least hardly flammable. Furthermore, they do not have a memory effect adversely affecting their heat storage capacity when undergoing several freezing and melting cycles. Salt hydrates also have a high volumetric latent heat storage capacity.

During experiments and numerical calculations it was confirmed that a stack of, for example, 400 of such salt hydrate PCM blocks inside the ventilation duct 10, each of them having a size of approximately 1100×700×2500 mm, a weight of approximately 1400 kg (incl. housing and base frame), and a heat capacity of approximately 183000 kJ is able to provide with 12 pieces of such ventilation ducts 10 the required total cooling capacity in the range of approximately 2200000 kJ for a room of approximately 160 m² area and 3.4 m height with approximately 25.5 kW heat load for at least 24 hours.

LIST OF REFERENCE NUMERALS

2 room
4 I&C component
6 VAC system
8 cabinet
10 ventilation duct
12 cooled air supply
14 outlet
16 floor
18 air exhaust
20 ceiling
22 housing
24 primary inlet
26 grille
30 heat storage element
32 support structure
34 PCM
36 secondary inlet
40 damper
44 airflow
58 wall
50 base frame
52 mass
54 lever
60 connection piece
62 supply air duct
66 guide vane

What is claimed is:

1. A ventilation and air conditioning system for a room, the room containing a heat source, the ventilation and air conditioning system comprising:
a cooled air supply;
a ventilation duct, the ventilation duct comprising a primary inlet being connected to the cooled air supply and an outlet leading into the room; and
a number of heat storage elements arranged inside the ventilation duct between the primary inlet and the outlet, such that during operation of the cooled air supply there is a forced stream of cooled air through the ventilation duct, thereby cooling and preferably freezing the heat storage elements,
a secondary inlet into the ventilation duct, the secondary inlet being in flow communication with the room and which during operation of the cooled air supply is closed by a damper,
the damper being designed to automatically open in a passive manner when the forced stream of cooled air from the cooled air supply stops, such that a natural convection airflow through the ventilation duct is supported, the natural convection airflow being cooled by transferring heat to the heat storage elements.

2. The ventilation and air conditioning system according to claim 1, wherein the heat storage elements comprise a phase change material.

3. The ventilation and air conditioning system according to claim 2, wherein the phase change material undergoes a solid-liquid phase transition in the temperature range mainly from 16° C. to 30° C.

4. The ventilation and air conditioning system according to claim 2, wherein the phase change material is based on salt hydrates.

5. The ventilation and air conditioning system according to claim 1, wherein the heat storage elements have a plate-like or sheet-like shape.

6. The ventilation and air conditioning system according to claim 1, wherein the damper is designed to automatically close in a passive manner due to the prevailing airflow pressure inside the ventilation duct during operation of the cooled air supply.

7. The ventilation and air conditioning system according to claim 1, wherein the opening force acting on the damper is achieved by a mass and/or a spring.

8. The ventilation and air conditioning system according to claim 1, wherein the outlet is placed close to the floor of the room.

9. The ventilation and air conditioning system according to claim 1, wherein the secondary inlet is placed close to the ceiling of the room.

10. The ventilation and air conditioning system according to claim 1, wherein the ventilation duct is essentially straight-lined and aligned vertically.

11. The ventilation and air conditioning system according to claim 1, wherein the heat source comprises a number of electric/electronic components.

12. A building comprising:
a room containing a heat source; and
the ventilation and air conditioning system according to claim 11 associated with the room.

13. A method of operating the ventilation and air conditioning system according to claim 1, wherein during operation of the cooled air supply the heat storage elements are cooled by the forced stream of cooled air, and wherein during subsequent natural convection mode the heat storage elements act as coolers for the natural convection airflow.

* * * * *